US 9,591,767 B2

(12) United States Patent
Itoi et al.

(10) Patent No.: US 9,591,767 B2
(45) Date of Patent: Mar. 7, 2017

(54) COMPONENT BUILT-IN BOARD AND METHOD OF MANUFACTURING THE SAME, AND COMPONENT BUILT-IN BOARD MOUNTING BODY

(71) Applicant: FUJIKURA LTD., Tokyo (JP)

(72) Inventors: Kazuhisa Itoi, Sakura (JP); Masahiro Okamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 126 days.

(21) Appl. No.: 14/290,173

(22) Filed: May 29, 2014

(65) Prior Publication Data
US 2014/0268574 A1 Sep. 18, 2014

Related U.S. Application Data

(63) Continuation of application No. PCT/JP2012/079463, filed on Nov. 14, 2012.

(30) Foreign Application Priority Data

Nov. 30, 2011 (JP) .................................. 2011-262217

(51) Int. Cl.
*H05K 1/02* (2006.01)
*H05K 1/18* (2006.01)
(Continued)

(52) U.S. Cl.
CPC ........... *H05K 3/10* (2013.01); *H01L 21/4857* (2013.01); *H01L 23/367* (2013.01);
(Continued)

(58) Field of Classification Search
CPC ...... H05K 3/10; H05K 1/0206; H05K 1/0207; H05K 3/4614; H05K 1/186; H01L 24/19;
(Continued)

(56) References Cited

U.S. PATENT DOCUMENTS 6,396,142 B1    5/2002  Ito et al.
6,400,573 B1 *  6/2002  Mowatt ............... H01L 23/5383
                                          174/252

(Continued)

FOREIGN PATENT DOCUMENTS

JP    2000-058735 A    2/2000
JP    2008-159682 A    7/2008
(Continued)

OTHER PUBLICATIONS

Extended European Search Report dated Jun. 26, 2015, issued in counterpart European application No. 12854222.2 (6 pages).
(Continued)

*Primary Examiner* — Ishwarbhai B Patel
(74) *Attorney, Agent, or Firm* — Westerman, Hattori, Daniels & Adrian, LLP

(57) ABSTRACT

A component built-in board comprises stacked therein a plurality of printed wiring bases having a wiring pattern and a via formed on/in a resin base thereof, and comprises an electronic component built in thereto, wherein at least a portion of the plurality of printed wiring bases include a thermal wiring in the wiring pattern and include a thermal via in the via, at least one of the plurality of printed wiring bases has formed therein an opening where the electronic component is built, and has formed therein a heat-conducting layer and closely attached to a surface on an opposite side to an electrode formation surface of the electronic component built in to the opening, and the electronic component is fixed in the opening by an adhesive layer stacked on the heat-conducting layer, via a hole formed in a region facing onto the opening of the heat-conducting layer.

5 Claims, 7 Drawing Sheets

(51) Int. Cl.
H05K 3/10 (2006.01)
H01L 23/538 (2006.01)
H01L 23/367 (2006.01)
H01L 21/48 (2006.01)
H01L 23/00 (2006.01)
H05K 3/00 (2006.01)
H05K 3/46 (2006.01)

(52) U.S. Cl.
CPC ...... *H01L 23/3677* (2013.01); *H01L 23/5389* (2013.01); *H01L 24/19* (2013.01); *H05K 1/0206* (2013.01); *H05K 1/0207* (2013.01); *H05K 1/186* (2013.01); *H05K 3/4614* (2013.01); *H01L 2224/02311* (2013.01); *H01L 2224/0401* (2013.01); *H01L 2224/04105* (2013.01); *H01L 2224/05569* (2013.01); *H01L 2224/08237* (2013.01); *H01L 2224/1132* (2013.01); *H01L 2224/11312* (2013.01); *H01L 2224/11334* (2013.01); *H01L 2224/11416* (2013.01); *H01L 2224/11418* (2013.01); *H01L 2224/12105* (2013.01); *H01L 2224/13009* (2013.01); *H01L 2224/1329* (2013.01); *H01L 2224/1336* (2013.01); *H01L 2224/1339* (2013.01); *H01L 2224/13294* (2013.01); *H01L 2224/13309* (2013.01); *H01L 2224/13311* (2013.01); *H01L 2224/13313* (2013.01); *H01L 2224/13316* (2013.01); *H01L 2224/13324* (2013.01); *H01L 2224/13339* (2013.01); *H01L 2224/13344* (2013.01); *H01L 2224/13347* (2013.01); *H01L 2224/13355* (2013.01); *H01L 2224/16225* (2013.01); *H01L 2224/16238* (2013.01); *H01L 2224/16503* (2013.01); *H01L 2224/2929* (2013.01); *H01L 2224/32225* (2013.01); *H01L 2224/73201* (2013.01); *H01L 2224/73251* (2013.01); *H01L 2224/73253* (2013.01); *H01L 2224/80203* (2013.01); *H01L 2224/80447* (2013.01); *H01L 2224/80903* (2013.01); *H01L 2224/8185* (2013.01); *H01L 2224/81192* (2013.01); *H01L 2224/81203* (2013.01); *H01L 2224/81862* (2013.01); *H01L 2224/81907* (2013.01); *H01L 2224/8349* (2013.01); *H01L 2224/8385* (2013.01); *H01L 2224/83192* (2013.01); *H01L 2224/83203* (2013.01); *H01L 2224/83862* (2013.01); *H01L 2224/9211* (2013.01); *H01L 2224/9221* (2013.01); *H01L 2924/07811* (2013.01); *H01L 2924/12042* (2013.01); *H01L 2924/15153* (2013.01); *H05K 3/0061* (2013.01); *H05K 3/4602* (2013.01); *H05K 2201/0969* (2013.01); *H05K 2201/10674* (2013.01); *Y10T 29/49126* (2015.01)

(58) Field of Classification Search
CPC .......... H01L 21/4857; H01L 23/3677; H01L 23/367; H01L 23/5389; H01L 2924/12042; H01L 2224/16225; H01L 2924/15153; H01L 2224/73201; H01L 2224/83192; H01L 2224/13009; H01L 2224/8349; H01L 2224/8185; H01L 2224/13324; H01L 2224/16238; H01L 2224/08237; H01L 2224/11418; H01L 2224/11312; H01L 2224/1132; H01L 2224/1336; H01L 2224/13316; H01L 2224/81862; H01L 2224/13355; H01L 2224/13344; H01L 2224/13313; H01L 2224/13311; H01L 2224/83862; H01L 2224/2929; H01L 2224/9211; H01L 2224/80903; H01L 2224/11416; H01L 2224/80203; H01L 2224/80447; H01L 2224/81907; H01L 2224/1329; H01L 2224/9221; H01L 2224/81192; H01L 2224/32225; H01L 2224/13309; H01L 2224/02311; Y10T 29/49126
See application file for complete search history.

(56) References Cited

U.S. PATENT DOCUMENTS

| | | | | |
|---|---|---|---|---|
| 7,514,636 | B2* | 4/2009 | Sasaki | H01L 23/3107 174/252 |
| 8,379,400 | B2* | 2/2013 | Sunohara | H01L 23/147 361/760 |
| 8,472,190 | B2* | 6/2013 | Refai-Ahmed | H01L 23/13 361/704 |
| 2005/0017347 | A1* | 1/2005 | Morimoto | H05K 1/186 257/703 |
| 2010/0213601 | A1 | 8/2010 | Smeys et al. | |

FOREIGN PATENT DOCUMENTS

| | | |
|---|---|---|
| JP | 2008-205124 A | 9/2008 |
| JP | 2008-305937 A | 12/2008 |
| JP | 2010-157663 A | 7/2010 |

OTHER PUBLICATIONS

International Search Report, dated Dec. 11, 2012, issued in corresponding application No. PCT/JP2012/079463.

* cited by examiner

COMPONENT BUILT-IN BOARD AND METHOD OF MANUFACTURING THE SAME, AND COMPONENT BUILT-IN BOARD MOUNTING BODY

CROSS-REFERENCE TO RELATED APPLICATIONS

This application is a continuation application of PCT Application No. PCT/JP2012/079463, filed on Nov. 14, 2012, which is based on and claims the benefit of priority from prior Japanese Patent Application No. 2011-262217, filed on Nov. 30, 2011, the entire contents of which are incorporated herein by reference.

BACKGROUND OF THE INVENTION

Field of the Invention

This invention relates to a component built-in board having an electronic component built in thereto, and a method of manufacturing the same, and to a component built-in board mounting body.

Description of the Prior Art

Known to achieve high density mounting of an electronic component is a component built-in board disclosed in Japanese Unexamined Patent Application Publication No. 2008-305937 A which has an electronic component built in to the board. Such a component built-in board has the electronic component buried in an insulating layer formed in a wiring board, hence it becomes a problem how efficiently heat generated by the electronic component is released to outside. A conventional component built-in board is configured to transmit heat generated by the electronic component to a heat sink (heat radiator) disposed in a layer above the wiring board via an insulating layer excelling in heat conductivity and a thermal via contacting a back surface (surface on an opposite side to a mounting surface) of the electronic component, and thereby radiate the heat generated by the electronic component.

SUMMARY OF THE INVENTION

In the above-described component built-in board of the conventional technology disclosed in Japanese Unexamined Patent Application Publication No. 2008-305937 A, connection between the back surface of the electronic component and the heat radiator is made via a thermal via formed by a heat-conducting resin composition. However, generally, heat conductivity of a conductive paste is lower than heat conductivity of copper, hence there is a problem that heat radiation characteristics are worse than when copper is connected.

On the other hand, in order to make heat more easily transmitted, the back surface of the electronic component is brought into direct contact with a heat-conducting member such as the heat radiator. On doing so, moisture that has infiltrated from outside infiltrates between the back surface of the electronic component and the heat radiator that have a weak force of attachment. Moreover, there is also a problem that a gap is generated therebetween, and reliability of the component built-in board gets lowered.

This invention has an object of overcoming the above-mentioned problems due to the conventional technology to provide a component built-in board in which close attachment between the electronic component and a heat-conducting layer can be secured and heat radiation characteristics can be improved, and a method of manufacturing the component built-in board, and to provide a component built-in board mounting body.

A component built-in board according to the present invention comprises stacked therein a plurality of printed wiring bases having a wiring pattern and a via formed on/in a resin base thereof, and comprises an electronic component built in thereto, wherein at least a portion of the plurality of printed wiring bases include a thermal wiring in the wiring pattern and include a thermal via in the via, at least one of the plurality of printed wiring bases has formed therein an opening where the electronic component is built, and has formed therein a heat-conducting layer configured from a metallic member and closely attached to a surface on an opposite side to an electrode formation surface of the electronic component built in to the opening, and the electronic component is fixed in the opening by an adhesive layer stacked on the heat-conducting layer, via a hole formed in a region facing onto the opening of the heat-conducting layer.

Due to the component built-in board according to the present invention, the surface on the opposite side to the electrode formation surface of the electronic component built in to the component built-in board is closely attached to the heat-conducting layer configured from the metallic member having a heat conductivity higher than that of a conductive paste in the opening, and is fixed in the opening by the adhesive layer stacked on the heat-conducting layer, via the hole formed in the region facing onto the opening of the heat-conducting layer, hence close attachment between the electronic component and the heat-conducting layer can be secured and heat radiation characteristics can be improved.

In an embodiment of the present invention, the hole is formed discretely in the region.

Moreover, in another embodiment of the present invention, the heat-conducting layer is connected via the thermal via and the thermal wiring to a bump formed in a surface layer of the component built-in board.

A method of manufacturing a component built-in board according to the present invention, the component built-in board comprising stacked therein a plurality of printed wiring bases that have a wiring pattern and a via formed on/in a resin base thereof, and the component built-in board comprising an electronic component built in thereto, comprises the steps of: forming the wiring pattern including a thermal wiring and the via including a thermal via in a plurality of the resin bases, forming in at least one of the plurality of resin bases an opening where the electronic component is built in, and forming a heat-conducting layer that is configured from a metallic member, includes a hole in a region facing onto the opening, and is closely attached to a surface on an opposite side to an electrode formation surface of the electronic component built in to the opening, thereby forming the plurality of printed wiring bases; and collectively stacking the plurality of printed wiring bases by thermal compression bonding such that the surface on the opposite side to the electrode formation surface of the electronic component is fixed in the opening by an adhesive layer stacked on the heat-conducting layer, via the hole and is thereby closely attached to the heat-conducting layer.

Due to the method of manufacturing a component built-in board according to the present embodiment, the surface on the opposite side to the electrode formation surface of the electronic component built in to the component built-in board is closely attached to the heat-conducting layer configured from the metallic member having a heat conductivity higher than that of a conductive paste in the opening, and is fixed in the opening by the adhesive layer stacked on the heat-conducting layer, via the hole formed in the region facing onto the opening of the heat-conducting layer, hence working effects similar to those described above can be displayed.

In an embodiment of the present invention, the hole is formed discretely in the region.

Another embodiment of the present invention further comprises the step of forming in a surface layer of the component built-in board a bump connected to the heat-conducting layer via the thermal via and the thermal wiring.

A component built-in board mounting body according to the present invention comprising a component built-in board mounted on a mounting board, the component built-in board comprising stacked therein a plurality of printed wiring bases that have a wiring pattern and a via formed on/in a resin base thereof, and the component built-in board comprising an electronic component built in thereto, wherein at least a portion of the plurality of printed wiring bases include a thermal wiring in the wiring pattern and include a thermal via in the via, at least one of the plurality of printed wiring bases has formed therein an opening where the electronic component is built, and has formed therein a heat-conducting layer configured from a metallic member and closely attached to a surface on an opposite side to an electrode formation surface of the electronic component built in to the opening, the electronic component is fixed in the opening by an adhesive layer stacked on the heat-conducting layer, via a hole formed in a region facing onto the opening of the heat-conducting layer, and the component built-in board is configured to be mounted on the mounting board via a bump formed in a surface layer of the component built-in board and connected to the heat-conducting layer via the thermal via and the thermal wiring.

Due to the component built-in board mounting body according to the present invention, the surface on the opposite side to the electrode formation surface of the electronic component built in to the component built-in board is connected to the mounting board via the heat-conducting layer, the thermal via, the thermal wiring, and the bump formed in the surface layer of the component built-in board. Therefore, heat of the electronic component is transmitted along the heat-conducting layer, the thermal via, the thermal wiring, and the bump that act as a heat radiation path, to be radiated efficiently and reliably to the mounting board. The mounting board has a sufficiently broad area compared to the electronic component or the component built-in board, hence is better as a heat radiation medium than a conventional kind of heat radiator, and does not need to be provided with a heat radiator. As a result, miniaturization is possible and flexibility of layout of the electronic component can be increased, and furthermore, improvement of heat radiation characteristics of the built in electronic component can be achieved.

In an embodiment of the present invention, the hole is formed discretely in the region.

Due to the present invention, close attachment between the electronic component and the heat-conducting layer can be secured and heat radiation characteristics can be improved.

DESCRIPTION OF THE PREFERRED EMBODIMENTS

A component built-in board and method of manufacturing the same and a component built-in board mounting body according to embodiments of this invention will be described in detail below with reference to the accompanying drawings.

First Embodiment

Figure 1:
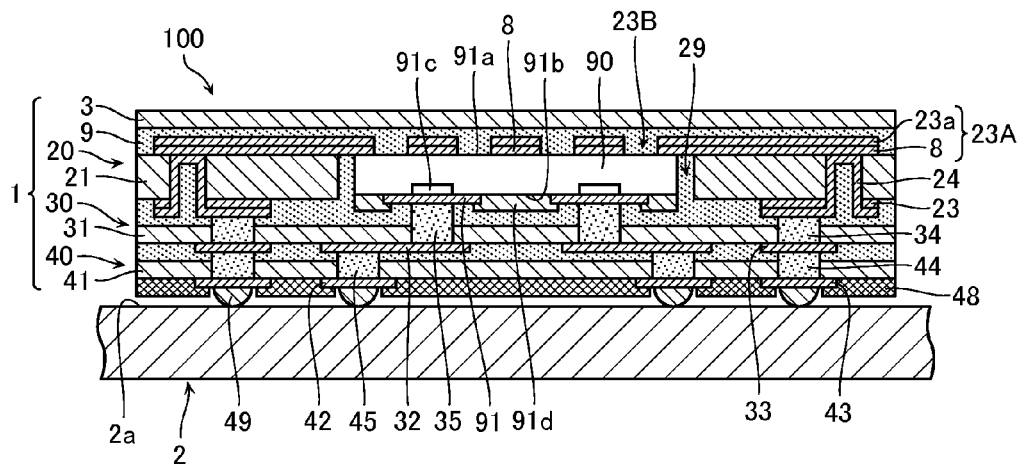
FIG. 1 is a cross-sectional view showing a structure of a component built-in board mounting body according to a first embodiment of the present invention.

FIG. 1 is a cross-sectional view showing a structure of a component built-in board mounting body according to a first embodiment of the present invention. As shown in FIG. 1, a component built-in board mounting body 100 according to the first embodiment is configured from a component built-in board 1 and a mounting board 2 on whose mounting surface 2a this component built-in board 1 is mounted.

The component built-in board 1 comprises a structure in which a second printed wiring base 20, a third printed wiring base 30, a fourth printed wiring base 40, and a cover lay film 3 substituting for a first printed wiring base are stacked collectively by thermal compression bonding. Moreover, the component built-in board 1 comprises an electronic component 90 which is built in to an opening 29 formed in a second resin base 21 of the second printed wiring base 20, in a state of being sandwiched by the third printed wiring base 30 and the cover lay film 3. Furthermore, the component built-in board 1 comprises a bump 49 formed on a mounting surface 2a side of the fourth printed wiring base 40.

The third and fourth printed wiring bases 30 and 40 respectively comprise: third and fourth resin bases 31 and 41; and signal-dedicated wiring lines 32 and 42, and thermal wiring lines 33 and 43 formed on at least one surface of these third and fourth resin bases 31 and 41. In addition, the third and fourth printed wiring bases 30 and 40 respectively comprise thermal vias 34 and 44, and signal-dedicated vias 35 and 45 that are formed by filling inside via holes formed in the third and fourth resin bases 31 and 41.

On the other hand, the second printed wiring base 20 comprises: a thermal wiring line 23 formed on one surface of the second resin base 21; a conductor layer 8 having a hole formed on another surface of the second resin base 21; and a thermal via 24 that is formed inside a via hole formed in the second resin base 21 such that both surfaces of the second resin base 21 are electrically continuous. Employable as these second through fourth printed wiring bases 20 to 40 are, for example, a single-sided copper clad laminated board (single-sided CCL) or a double-sided copper clad laminated board (double-sided CCL), and so on.

In the present example, the second printed wiring base 20 is formed based on a double-sided CCL, and the third and fourth printed wiring bases 30 and 40 are formed based on a single-sided CCL. Therefore, the conductor layer 8 and the thermal wiring line 23 of the second printed wiring base 20 are formed on both surfaces of the second resin base 21, and the thermal via 24 provides interlayer connection between the conductor layer 8 and the thermal wiring line 23 of both these surfaces.

In this case, the thermal via 24 is configured from a structure in which, for example, a plating is applied inside a through-hole formed from a thermal wiring line 23 side without penetrating the conductor layer 8, and is formed by, for example, a copper plating. At this time, it is also possible to adopt a structure where the inside of the through-hole is filled with a conductive paste instead of being plated. Note that the conductor layer 8, along with a plated layer 23a formed thereon, configure a heat-conducting layer 23A that conducts heat from the electronic component 90.

The second through fourth resin bases 21 to 41 and the cover lay film 3 are each configured by, for example, a resin film having a thickness of about 25 μm. Now, employable as the resin film are, for example, a resin film configured from the likes of a polyimide, polyolefin, or liquid crystal polymer, or a resin film configured from a thermosetting epoxy resin, and so on.

The electronic component 90 is the likes of a semiconductor component such as an IC chip, for example, or a passive component, and the electronic component 90 shown in FIG. 1 indicates a WLP (Wafer Level Package) that has been rewired. Provided on an electrode formation surface 91b of the electronic component 90 are a plurality of rewiring electrodes 91 each formed on a pad 91c, and formed in a periphery of the rewiring electrode 91 is an insulating layer 91d.

Note that the signal-dedicated wiring lines 32 and 42, and the thermal wiring lines 23, 33, and 43 are configured by, for example, pattern-forming a conductive material such as copper foil having a thickness of about 12 μm. The signal-dedicated vias 35 and 45, and the thermal vias 34 and 44 are configured from a conductive paste respectively filled into the via holes, and the thermal via 24 is formed by plating as described above. The thermal wiring lines and thermal vias, excluding a portion thereof, are formed to be disposed on an outer peripheral side of the electronic component 90.

The conductive paste includes, for example, at least one kind of metallic particle of low electrical resistance selected from the likes of nickel, gold, silver, copper, aluminum, andiron, and at least one kind of metallic particle of low melting point selected from the likes of tin, bismuth, indium, and lead, and is configured from a paste that has mixed therein a binder component whose main component is an epoxy, an acrylic, a urethane, and so on.

The conductive paste configured in this way has low heat conductivity of, for example, 5 to 13.5 W/(m·K), and enables the metal of low melting point contained therein to melt and form an alloy at a temperature of 200° C. or less, specifically the likes of copper or silver comprise characteristics allowing an intermetallic compound to be formed. Note that the conductive paste may also be configured by a nanopaste in which, for example, a filler of the likes of gold, silver, copper, or nickel with a nanolevel particle diameter is mixed into a binder component of the above-described kind.

In addition, the conductive paste may also be configured by a paste having metallic particles of the above-described nickel, and so on, mixed into a binder component of the above-described kind. In this case, the conductive paste is characterized in that electrical connection is performed by contact between fellow metallic particles. Employable as a method of filling the conductive paste into the via holes is, for example, a printing method, a spin coating method, a spray coating method, a dispensing method, a laminating method, a method combining use of these methods, and so on.

The bump 49 is configured from the likes of solder, and is formed at a portion above the signal-dedicated wiring line 42 and the thermal wiring line 43 formed on the mounting surface 2a side of the fourth resin base 41 of the fourth printed wiring base 40 not covered by a solder resist 48. The component built-in board 1 is mounted on the mounting surface 2a of the mounting board 2 via these bumps 49. Note that the second through fourth printed wiring bases 20 to 40 and the cover lay film 3 are stacked via an adhesive layer 9. The adhesive layer 9 is configured from, for example, the likes of an epoxy system or acrylic system adhesive material, or the likes of an organic system adhesive material including a volatile component.

The electronic component 90 disposed in the opening 29 of the second printed wiring base 20 has a back surface 91a thereof on an opposite side to the electrode formation surface 91b thereof closely attached to the conductor layer 8 of the heat-conducting layer 23A. In addition, the back surface 91a is adhered by the adhesive layer 9 of the cover lay film 3, via a hole 23B formed in a region facing onto the opening 29 of the heat-conducting layer 23A. As a result, the electronic component 90 is fixed in the opening 29 in a state where the back surface 91a and the conductor layer 8 have been closely attached.

In the case that the conductor layer 8 is configured from a copper foil of pure copper, the pure copper has an extremely high heat conductivity of 403 W/(m·K) at 0° C. and 395 W/(m·K) at 100° C., hence closely attaching the conductor layer 8 to the back surface 91a is extremely effective in improving heat radiation characteristics. Note that if the electronic component 90 is fixed in the opening 29 without providing the hole 23B, then the conductor layer 8 and the back surface 91a of the electronic component 90 cannot be directly adhered, hence some kind of adhesive medium becomes required between these conductor layer 8 and back surface 91a of the electronic component 90 and heat conducting characteristics are inferior compared to when the electronic component 90 is closely attached to the conductor layer 8 having a hole.

The component built-in board mounting body 100 configured in this way leads to a structure in which the electronic component 90 is disposed between the heat-conducting layer 23A and the mounting board 2. Moreover, heat of the electronic component 90 built in to the component built-in board 1 follows the following heat radiation path to be transmitted to the mounting board 2. That is, heat of the electronic component 90 is transmitted from the back surface 91a of the electronic component 90 to the heat-conducting layer 23A of the second printed wiring base 20.

Heat transmitted to the heat-conducting layer 23A passes through the thermal via 24 formed on the outer peripheral side of the electronic component 90 to be transmitted to the thermal via 34 and the thermal wiring line 33 of the third printed wiring base 30, and is further transmitted to the thermal via 44 and the thermal wiring line 43 of the fourth printed wiring base 40 to be transmitted to the bump 49. Heat transmitted to the bump 49 in this way is transmitted via this bump 49 to the mounting board 2 which has an area larger than that of the component built-in board 1, to be radiated from the mounting board 2.

Due to such a structure, almost all of the heat generated by the electronic component 90 built in to the component built-in board 1 is radiated by being transmitted to the mounting board 2 from the component built-in board 1 that has a structure not requiring a conventional kind of heat radiator.

Next, a method of manufacturing the component built-in board according to the first embodiment will be described. FIGS. 2 to 5 are flowcharts each showing manufacturing steps of the component built-in board mounting body. FIGS. 6A to 9 are cross-sectional views each showing the component built-in board mounting body on a manufacturing step basis. Note that details of manufacturing steps are shown for the third and fourth printed wiring bases 30 and 40 in FIGS. 2 and 6A to 6E, for the second printed wiring base 20 in FIGS. 3 and 7A to 7E, for the electronic component in FIGS. 4 and 8A to 8D, and for the component built-in board mounting body in FIGS. 5 and 9.

First, the manufacturing steps of the third and fourth printed wiring bases 30 and 40 will be described. Note that these can be manufactured by similar steps, hence although here, the manufacturing steps of the fourth printed wiring base 40 will be described representatively with reference to FIG. 2, the same applies also to the third printed wiring base 30.

Figure 6A:
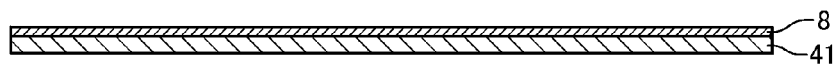
FIG. 6A is a cross-sectional view showing same component built-in board mounting body on a manufacturing step basis.
Figure 6B:
FIG. 6B is a cross-sectional view showing same component built-in board mounting body on a manufacturing step basis.

As shown in FIG. 6A, a single-sided copper clad laminated board (single-sided CCL) in which the conductor layer 8 is formed on one surface of the fourth resin base 41, is prepared (step S100). Next, an etching resist is formed on the conductor layer 8 by photolithography, and then etching is performed to form a wiring pattern of the signal-dedicated wiring line 42, the thermal wiring line 43, and so on, as shown in FIG. 6B (step S102).

The single-sided CCL used in step S100 is, for example, configured from a structure in which the fourth resin base 41 having a thickness of about 25 μm is affixed to the conductor layer 8 configured from a copper foil having a thickness of about 12 μm. Note that usable as this single-sided CCL is, for example, a single-sided CCL produced by applying a varnish of polyimide to the copper foil and hardening the varnish, by a casting method.

The casting method is a publicly known method of forming a flat film or sheet by extruding resin melted by an extruder from a linear slit provided in a flat die, and rapidly cooling the melted film by a cooled roller, and winding the film while rolling the film. This method is highly reliable and frequently used.

Otherwise usable as the single-sided CCL are the likes of a single-sided CCL in which a seed layer is formed on a polyimide film by sputtering and the conductor layer 8 is formed by growing copper by plating, or a single-sided CCL produced by attaching a rolled or electrolytic copper foil and a polyimide film by an adhesive material. Note that the fourth resin base 41 is not necessarily required to be configured from a polyimide, and may be configured from a plastic film of a liquid crystal polymer, or the like. Moreover, the etching in step S102 may employ the likes of an etchant whose main component is ferric chloride or an etchant whose main component is cupric chloride.

Figure 6C:
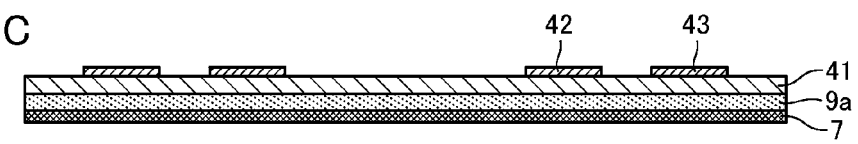
FIG. 6C is a cross-sectional view showing same component built-in board mounting body on a manufacturing step basis.

When the wiring pattern has been formed, then as shown in FIG. 6C, a surface on an opposite side to a signal-dedicated wiring line 42 and thermal wiring line 43 formation surface side of the fourth resin base 41 has an adhesive material 9a and a mask material 7 attached thereto by heat pressing (step S104). Usable as the adhesive material 9a attached in step S104 is, for example, an epoxy system thermosetting film having a thickness of about 25 μm. The heat pressing includes employing a vacuum laminator to press and attach the adhesive material 9a and mask material 7 to the fourth resin base 41 in a reduced pressure atmosphere, at a temperature less than or equal to a curing temperature of the adhesive material 9a, by a pressure of 0.3 MPa.

Note that an inter-layer adhesive material employed in the adhesive layer 9 or the adhesive material 9a may be not only an epoxy system thermosetting resin, but also the likes of an acrylic system adhesive material or a thermoplastic adhesive material typified by a thermoplastic polyimide, or the like. Moreover, the inter-layer adhesive material is not necessarily required to be in a film state, and may have resin coated in a varnish state. Employable as the mask material are various kinds of films attachable or detachable by UV irradiation, in addition to the above-mentioned resin film or a plastic film of the likes of PET and PEN.

Figure 6D:
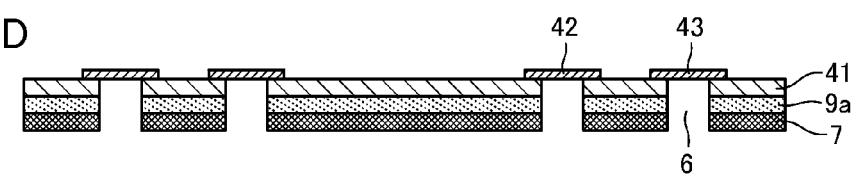
FIG. 6D is a cross-sectional view showing same component built-in board mounting body on a manufacturing step basis.

Then, as shown in FIG. 6D, a via hole 6 penetrating the mask material 7, the adhesive material 9a, and the fourth resin base 41 from an attached mask material 7 side toward the signal-dedicated wiring line 42 and the thermal wiring line 43, is formed at a certain place (step S106), and an inside of the via hole 6 undergoes, for example, plasma desmear processing.

The via hole 6 formed in step S106 has a diameter φ of about 100 μm, and is formed in a certain place using a UV laser. The via hole 6 may otherwise be formed by the likes of a carbon dioxide laser or an excimer laser, or may be formed by the likes of drill processing or chemical etching. Moreover, the plasma desmear processing can be performed by a mixed gas of $CF_4$ and $O_2$ (tetrafluoromethane+oxygen), but may also employ another inert gas such as Ar (argon), and may be configured as wet desmear processing employing a chemical, rather than so-called dry processing.

Figure 6E:
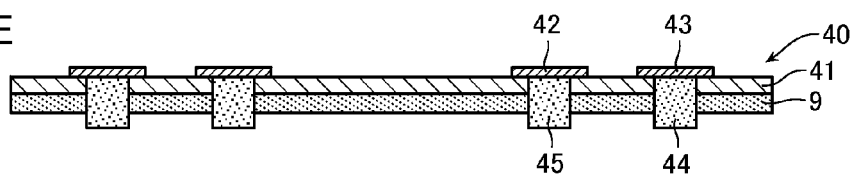
FIG. 6E is a cross-sectional view showing same component built-in board mounting body on a manufacturing step basis.

Then, as shown in FIG. 6E, the conductive paste is filled into the formed via hole 6 by, for example, screen printing to form the various kinds of vias of the signal-dedicated via 45 and the thermal via 44 (step S108), and the mask material 7 is detached, thereby forming the fourth printed wiring base 40 that includes the fourth resin base 41 provided with the adhesive layer 9. Note that the thermal via 44 may be configured formed by a plating rather than the conductive paste, in order to achieve improvement in heat conductivity. Such a processing is performed to form and prepare the third printed wiring base 30 or additional printed wiring bases in the case of further multiple layers.

Figure 3:
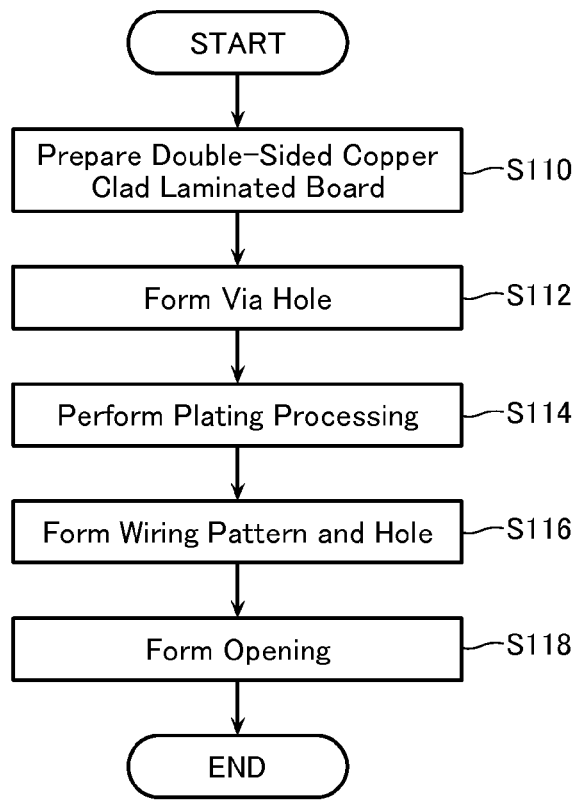
FIG. 3 is a flowchart showing manufacturing steps of same component built-in board mounting body.
Figure 4:
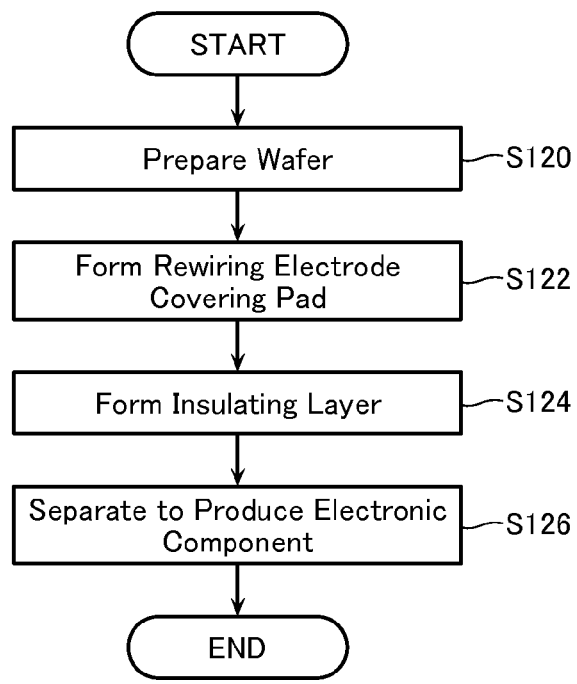
FIG. 4 is a flowchart showing manufacturing steps of same component built-in board mounting body.
Figure 7A:
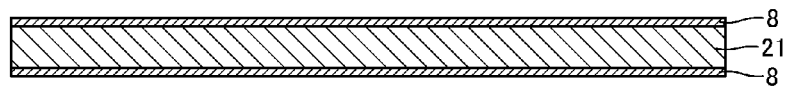
FIG. 7A is a cross-sectional view showing same component built-in board mounting body on a manufacturing step basis.
Figure 7B:
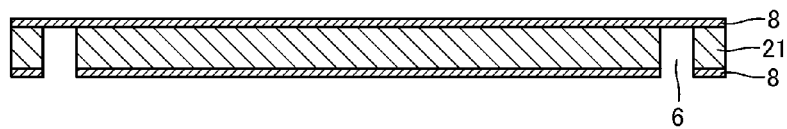
FIG. 7B is a cross-sectional view showing same component built-in board mounting body on a manufacturing step basis.

Next, the manufacturing steps of the second printed wiring base 20 will be described with reference to FIG. 3. Note that places already described are assigned with identical symbols and descriptions thereof sometimes omitted, and that the above-described content is assumed to be applicable to the specific processing content of each of the steps. First, as shown in FIG. 7A, a double-sided copper clad laminated board (double-sided CCL) in which the conductor layer 8 is formed (in a solid state) along an entire surface on both surfaces of the second resin base 21, is prepared (step S110), and as shown in FIG. 7B, the via hole 6 is formed at a certain place (step S112), and plasma desmear processing is performed.

Figure 7C:
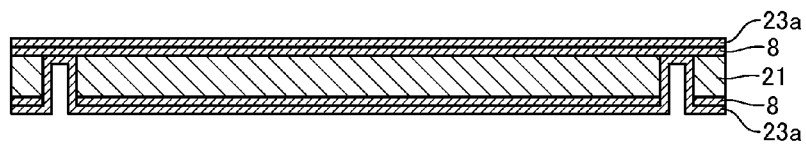
FIG. 7C is a cross-sectional view showing same component built-in board mounting body on a manufacturing step basis.

Next, as shown in FIG. 7C, panel plate processing is performed on all surfaces of the second resin base 21 (step S114), to form a plated layer 23a on the conductor layer 8 and in the via hole 6. Note that the plated layer 23a in the via hole 6 is a plated via employed later as the thermal via 24 and provides electrical continuity between the conductive layers 8 of both surfaces of the second resin base 21.

Figure 7D:
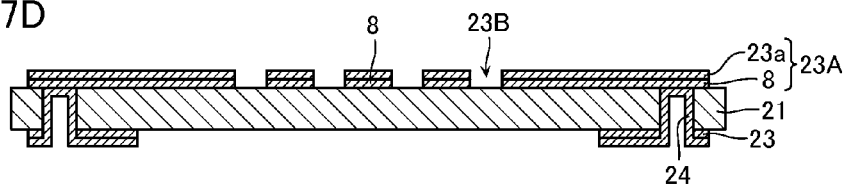
FIG. 7D is a cross-sectional view showing same component built-in board mounting body on a manufacturing step basis.

Then, as shown in FIG. 7D, etching, and so on, is performed on both surfaces of the second resin base 21 to form a wiring pattern of the likes of the heat-conducting layer 23A configured from the conductor layer 8 and the plated layer 23a, or the thermal wiring line 23 and thermal via 24, and to form in the heat-conducting layer 23A the hole 23B for adhering the electronic component 90 (step S116).

Figure 10:
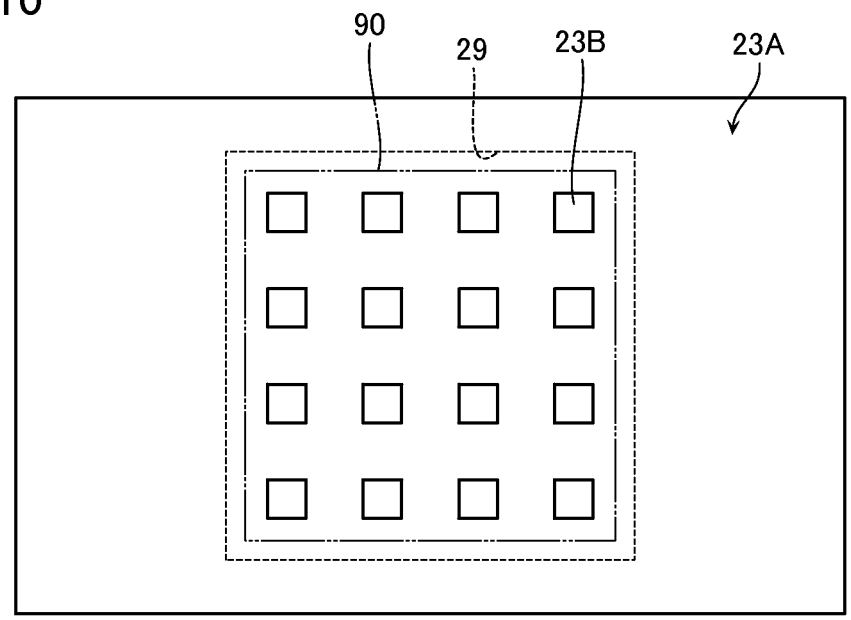
FIG. 10 is a plan view of a heat-conducting layer of same component built-in board mounting body.
Figure 11:
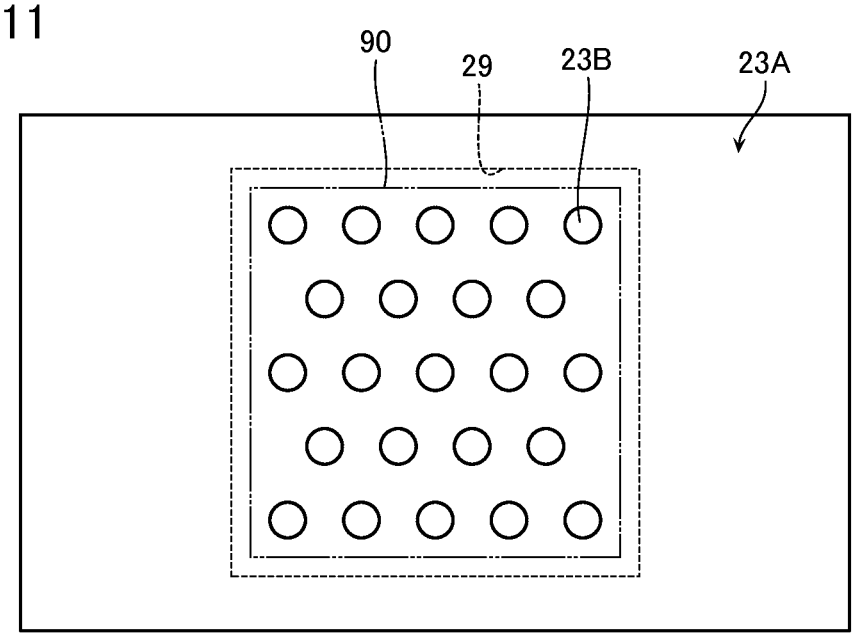
FIG. 11 is a plan view of another heat-conducting layer of same component built-in board mounting body.
Figure 12:
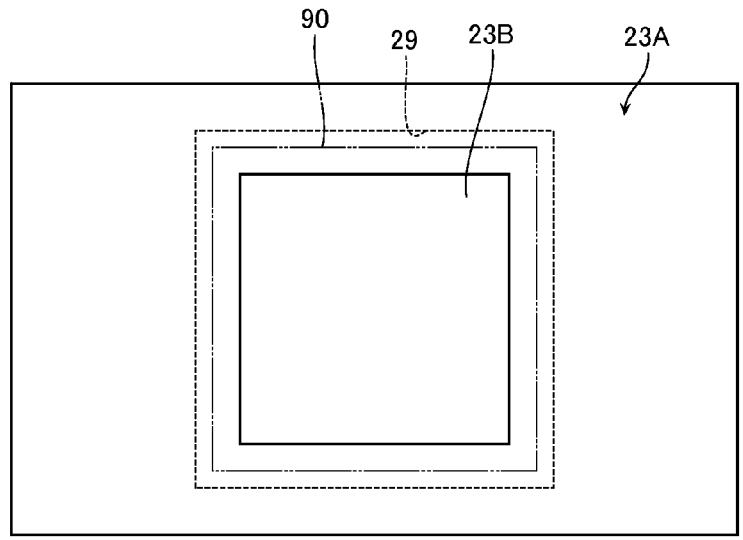
FIG. 12 is a plan view of yet another heat-conducting layer of same component built-in board mounting body.

Note that as shown in, for example, FIG. 10, a plurality of the holes 23B formed in the heat-conducting layer 23A in this step S116 are pattern formed in a rectangular shape and a mesh shape in a range which is narrower than a region that will be the opening 29 and is narrower than the area of the electronic component 90. Because the holes 23B are arranged discretely and the adhesive material that has worked into the hole 23B and the back surface 91a of the electronic component 90 are adhered, it is possible to prevent moisture collecting between the back surface 91a of the electronic component 90 and the heat-conducting layer 23A that have a weak force of attachment and to prevent the moisture evaporating by the likes of heat application due to reflow and so on during mounting or heat generation of the electronic component chip, and to thereby prevent a gap occurring between these back surface 91a of the electronic component 90 and the heat-conducting layer 23A and reliability of the component built-in board getting lowered. In addition, the holes 23B may be configured formed in a circular shape and a mesh shape as shown in FIG. 11 or formed as a single rectangular shaped hole 23B as shown in FIG. 12. Furthermore, although not illustrated in the drawings, the holes 23B may be formed in various kinds of patterns such as to leave an area where the back surface 91a of the electronic component 90 and the heat-conducting layer 23A are closely attached, such as a pattern where each of a plurality of the holes 23B has a different size or a grid-like pattern, and so on.

Figure 7E:
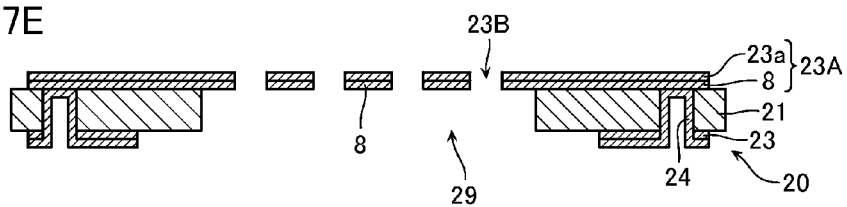
FIG. 7E is a cross-sectional view showing same component built-in board mounting body on a manufacturing step basis.

Finally, as shown in FIG. 7E, the second resin base 21 at a portion thereof where the electronic component 90 is to be built in is removed by a UV laser, or the like, and the opening 29 is formed (step S118), thereby forming the second printed wiring base 20.

Figure 8A:
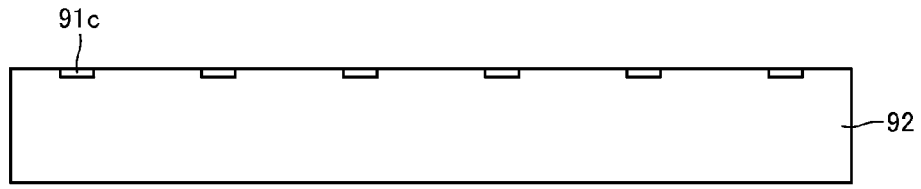
FIG. 8A is a cross-sectional view showing same component built-in board mounting body on a manufacturing step basis.

Note that the electronic component 90 built in to the opening 29 of the second printed wiring base 20 formed in this way is manufactured, for example, as follows. The manufacturing steps of the electronic component 90 will be described with reference to FIG. 4. First, as shown in FIG. 8A, a pre-dicing wafer 92 having formed therein an inorganic insulating layer of the likes of silicon oxide or silicon nitride, is prepared (step S120).

Figure 8B:
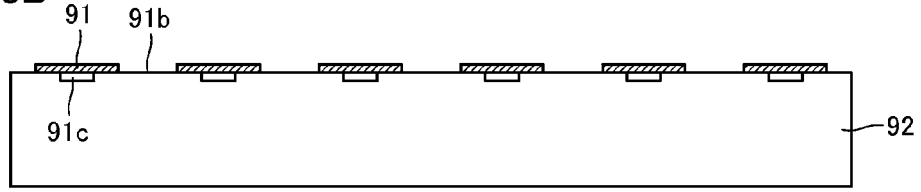
FIG. 8B is a cross-sectional view showing same component built-in board mounting body on a manufacturing step basis.

Next, as shown in FIG. 8B, a conductor circuit (not illustrated) or the rewiring electrode 91 covering the pad 91c is formed above the pad 91c of the electronic component 90 and above the inorganic insulating layer on a surface of the prepared wafer 92 by, for example, a semi-additive method (step S122).

Figure 8C:
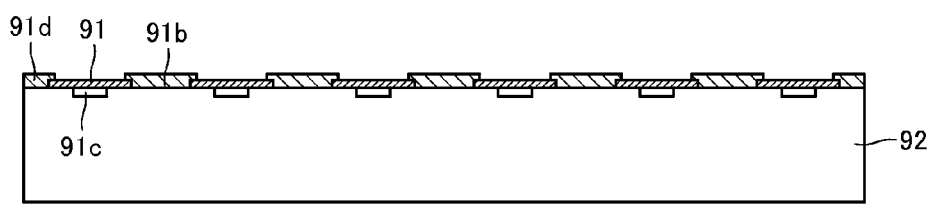
FIG. 8C is a cross-sectional view showing same component built-in board mounting body on a manufacturing step basis.
Figure 8D:
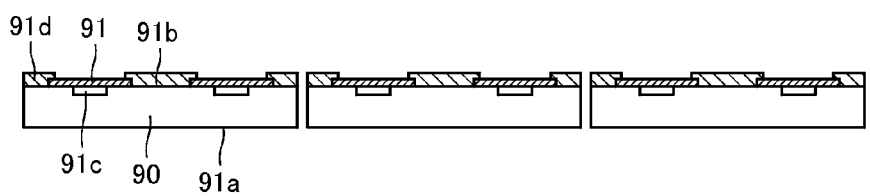
FIG. 8D is a cross-sectional view showing same component built-in board mounting body on a manufacturing step basis.

Then, as shown in FIG. 8C, a contact hole is formed by, for example, spin-coating a liquid-form photosensitive polyimide precursor and performing photolithography, and then the insulating layer 91d is formed by calcination (step S124). Finally, testing is performed by probing, and as shown in FIG. 8D, the electronic component 90 is produced by separating into an individual piece by thinning and dicing (step S126).

Note that employable as resin of the insulating layer 91d formed in step S124 are, for example, benzo-cyclo-butene (BCB) or poly-benzo-oxazole (PBO), and so on. Moreover, the photosensitive resin does not necessarily need to be coated by spin coating, and may be coated by curtain coating or screen printing, or by spray coating, and so on. The electronic component 90 produced in this way may also be provided with various functions of an inductor, a capacitor, a resistance, and so on, as well as an ordinary conductive circuit.

Figure 9:
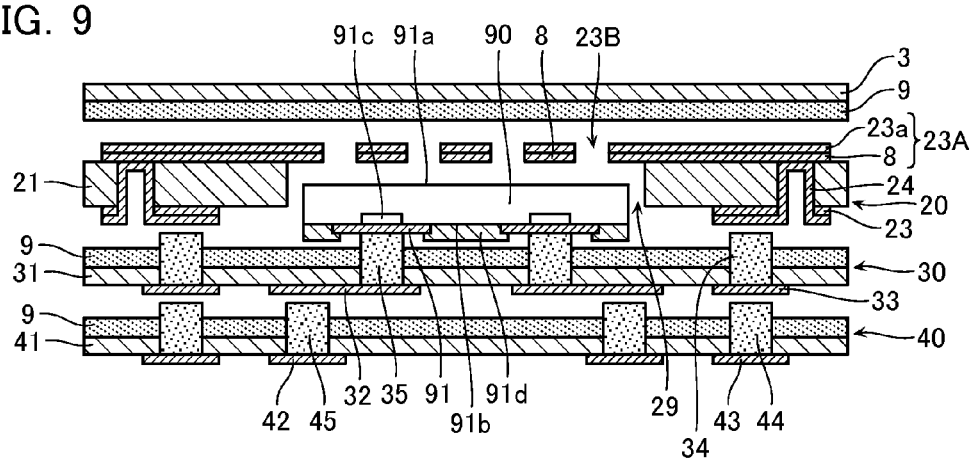
FIG. 9 is a cross-sectional view showing same component built-in board mounting body on a manufacturing step basis.

When the second through fourth printed wiring bases 20 to 40 and the electronic component 90 have been produced in this way, then as shown in FIG. 9, the rewiring electrode 91 of the electronic component 90 and the signal-dedicated via 35 of the third printed wiring base 30 are aligned by an electronic component mounting device, and the electronic component 90 is provisionally adhered to the third printed wiring base 30 in a state where the adhesive layer 9 of the third printed wiring base 30 and the conductive paste of the signal-dedicated via 35 are uncured.

Figure 5:
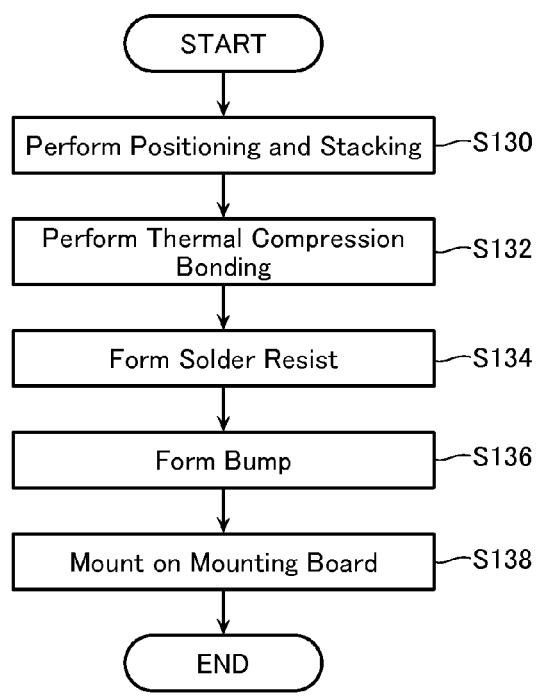
FIG. 5 is a flowchart showing manufacturing steps of same component built-in board mounting body.

Then, as shown in FIG. 5, each of the printed wiring bases 20 to 40, the electronic component 90, and the cover lay film 3 on which the adhesive layer 9 is formed, are positioned and stacked (step S130). For example, a vacuum press is employed to collectively stack by thermal compression bonding by applying heat and pressure in a reduced pressure atmosphere of 1 kPa or less (step S132), and first, the component built-in board 1 of the kind shown in FIG. 1 is manufactured. At this time, curing and alloying of the conductive paste filled into the via hole 6 is performed simultaneously to curing of each of the inter-layer adhesive layers 9 or each of the resin bases 21 and 31, and so on. Therefore, an alloy layer of an intermetallic compound is formed between the conductive paste and the wiring lines and so on contacting the conductive paste.

Then, the fourth resin base 41 on the signal-dedicated wiring line 42 and thermal wiring line 43 side of the fourth printed wiring base 40 in the component built-in board 1 has the solder resist 48 pattern-formed thereon (step S134). When the solder resist 48 has been formed, the bump 49 is formed on each of the wiring lines 42 and 43 by solder or the like (step S136), and the component built-in board 1 is mounted on the mounting surface 2a of the mounting board 2 (step S138), thereby manufacturing the component built-in board mounting body 100 according to the first embodiment of the kind shown in FIG. 1.

Second Embodiment

Figure 13:
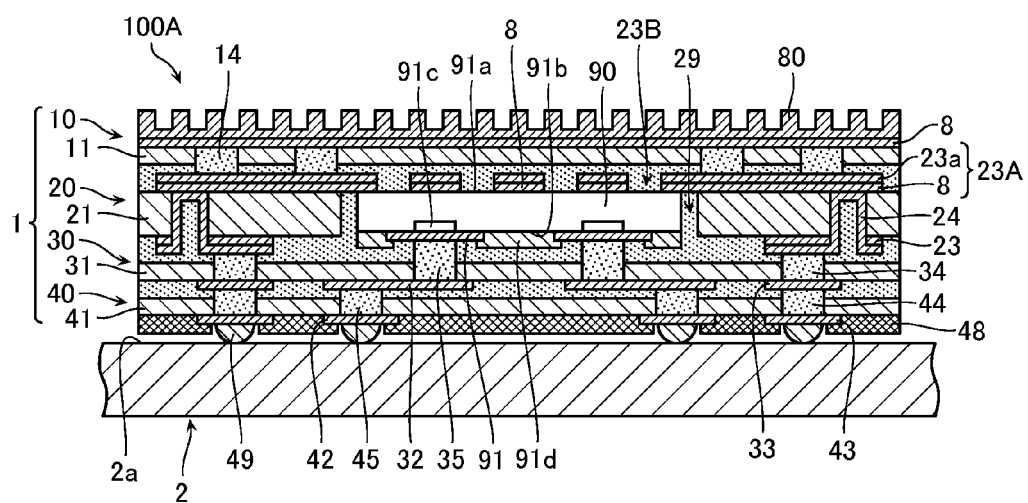
FIG. 13 is a cross-sectional view showing a structure of a component built-in board mounting body according to a second embodiment of the present invention.

FIG. 13 is a cross-sectional view showing a structure of a component built-in board mounting body according to a second embodiment of the present invention. As shown in FIG. 13, a component built-in board mounting body 100A according to the second embodiment differs from the component built-in board mounting body 100 according to the first embodiment in having a first printed wiring base 10 stacked in place of the cover lay film 3 and in having heat of the electronic component 90 radiated not only from the mounting board 2 but also from a first printed wiring base 10 side.

Figure 2:
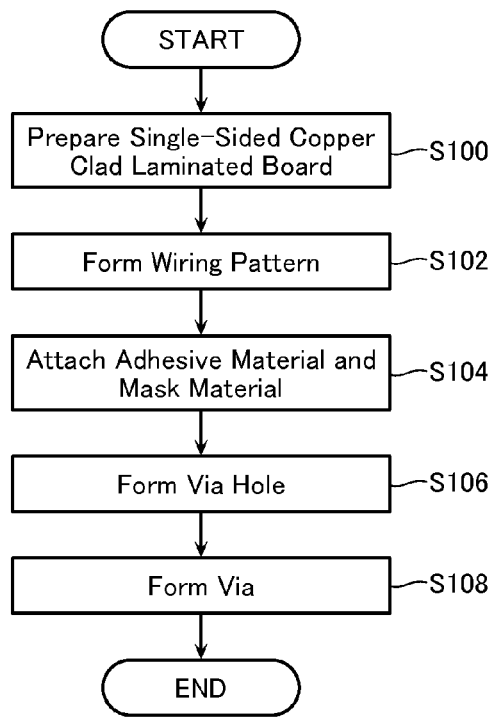
FIG. 2 is a flowchart showing manufacturing steps of same component built-in board mounting body.

Specifically, the first printed wiring base 10 basically can be manufactured by steps similar to those for the fourth printed wiring base 40 described using FIGS. 2 and 6, and is configured from a structure in which the conductor layer 8 having a solid pattern is formed on one surface of the first resin base 11. Different from the fourth printed wiring base 40 is the fact that the conductor layer 8 of the single-sided CCL is utilized unchanged without forming the wiring pattern in step S102, and a stacked form has front and back reversed.

The first printed wiring base 10 configured in this way has formed therein a plurality of thermal vias 14 connected to the conductor layer 8, and is stacked in a state where each of the thermal vias 14 is connected to the heat-conducting layer 23A of the second printed wiring base 20. In addition, a heat radiation-dedicated fin 80 which is separately formed and is configured from a member of high heat conductivity is connected in close attachment along an entire surface on the conductor layer 8.

Therefore, heat generated by the electronic component 90 passes through the heat-conducting layer 23A to be radiated from the mounting board 2, and passes through the thermal via 14 and the conductor layer 8 to be radiated also from the heat radiation-dedicated fin 80. As a result, heat radiation characteristics can be further improved.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A component built-in board comprising:
a plurality of printed wiring bases stacked therein and having a resin base, and a wiring pattern and a via formed on/in the resin base; and
an electronic component built in the component built-in board, wherein
at least a portion of the plurality of printed wiring bases include a thermal wiring in the wiring pattern and include a thermal via in the via,
at least one of the plurality of printed wiring bases has formed therein an opening where the electronic component is built, and has formed therein a heat-conducting layer configured from a metallic member and closely attached to an opposite surface of the electronic component on an opposite side to an electrode formation surface of the electronic component built in to the opening,
the electronic component is fixed in the opening by an adhesive layer stacked on the heat-conducting layer, via a hole formed in a region of the heat-conducting layer facing onto the opening, the adhesive layer contacting the opposite surface via the hole of the heat-conducting layer, and
wherein the heat-conducting layer is connected to the thermal via and the thermal wiring.

2. The component built-in board according to claim 1, wherein the hole is formed discretely in the region.

3. The component built-in board according to claim 1, wherein the heat-conducting layer is connected via the thermal via and the thermal wiring to a bump formed in a surface layer of the component built-in board.

4. A component built-in board mounting body comprising:
a mounting board; and
a component built-in board mounted on the mounting board,
the component built-in board comprising:
a plurality of printed wiring bases stacked therein that have a resin base, and a wiring pattern and a via formed on/in the resin base, and
an electronic component built in the component built-in board, wherein
at least a portion of the plurality of printed wiring bases include a thermal wiring in the wiring pattern and include a thermal via in the via,
at least one of the plurality of printed wiring bases has formed therein an opening where the electronic component is built, and has formed therein a heat-conducting layer configured from a metallic member and closely attached to an opposite surface of the electronic component on an opposite side to an electrode formation surface of the electronic component built in to the opening,
the electronic component is fixed in the opening by an adhesive layer stacked on the heat-conducting layer, via a hole formed in a region of the heat-conducting layer facing onto the opening, the adhesive layer contacting the opposite surface via the hole of the heat-conducting layer,
wherein the heat-conducting layer is connected to the thermal via and the thermal wiring, and
the component built-in board is configured to be mounted on the mounting board via a bump formed in a surface layer of the component built-in board and connected to the heat-conducting layer via the thermal via and the thermal wiring.

5. The component built-in board mounting body according to claim 4, wherein the hole is formed discretely in the region.

* * * * *